(12) United States Patent
Bellet et al.

(10) Patent No.: US 11,430,681 B2
(45) Date of Patent: Aug. 30, 2022

(54) DEVICE AND METHOD FOR CONTROLLING THE TIGHTNESS OF A TRANSPORT ENCLOSURE FOR THE CONVEYANCE AND ATMOSPHERIC STORAGE OF SEMICONDUCTOR SUBSTRATES

(71) Applicant: PFEIFFER VACUUM, Annecy (FR)

(72) Inventors: Bertrand Bellet, Annecy (FR); Julien Bounouar, Annecy (FR); Nicolas Chapel, Sales (FR)

(73) Assignee: PFEIFFER VACUUM, Annecy (FR)

( * ) Notice: Subject to any disclaimer, the term of this patent is extended or adjusted under 35 U.S.C. 154(b) by 718 days.

(21) Appl. No.: 16/338,783

(22) PCT Filed: Nov. 6, 2017

(86) PCT No.: PCT/EP2017/078367
§ 371 (c)(1),
(2) Date: Apr. 2, 2019

(87) PCT Pub. No.: WO2018/083312
PCT Pub. Date: May 11, 2018

(65) Prior Publication Data
US 2020/0051844 A1    Feb. 13, 2020

(30) Foreign Application Priority Data
Nov. 7, 2016   (FR) ...................... 1660750

(51) Int. Cl.
*B65G 47/91*      (2006.01)
*H01L 21/673*     (2006.01)

(52) U.S. Cl.
CPC ........ *H01L 21/67393* (2013.01); *B65G 47/91* (2013.01); *H01L 21/67376* (2013.01);
(Continued)

(58) Field of Classification Search
CPC ........ H01L 21/67393; H01L 21/67376; B65G 47/91
See application file for complete search history.

(56) References Cited

U.S. PATENT DOCUMENTS 8,074,597 B2 * 12/2011 Shah ................. H01L 21/67353
156/345.31
9,171,748 B2 * 10/2015 Hatano ............. H01L 21/67379
(Continued)

FOREIGN PATENT DOCUMENTS

JP    2003-315197 A1    11/2003
JP    2007-227800 A      9/2007
(Continued)

OTHER PUBLICATIONS

Japanese Office Action dated Aug. 3, 2021 in Japanese Patent Application No. 2019-522564 (with English translation), 20 pages.
(Continued)

*Primary Examiner* — Jason K Niesz
(74) *Attorney, Agent, or Firm* — Oblon, McClelland, Maier & Neustadt, L.L.P.

(57) ABSTRACT

There is provided a device and method for controlling a tightness of at least one transport enclosure for conveyance and atmospheric storage of semiconductor substrates, the transport enclosure including at least two ventilation ports, the device including at least one interface configured to be coupled to the transport enclosure, the interface including at least two connecting heads, at least one connecting head of the heads being formed by a measurement head configured to engage in a ventilation port of the ventilation ports of the transport enclosure, the measurement head including a projecting end piece, opening through at least one aperture, and a peripheral sealing element surrounding the end piece, all of the ventilation ports of the transport enclosure being
(Continued)

Figure 1:
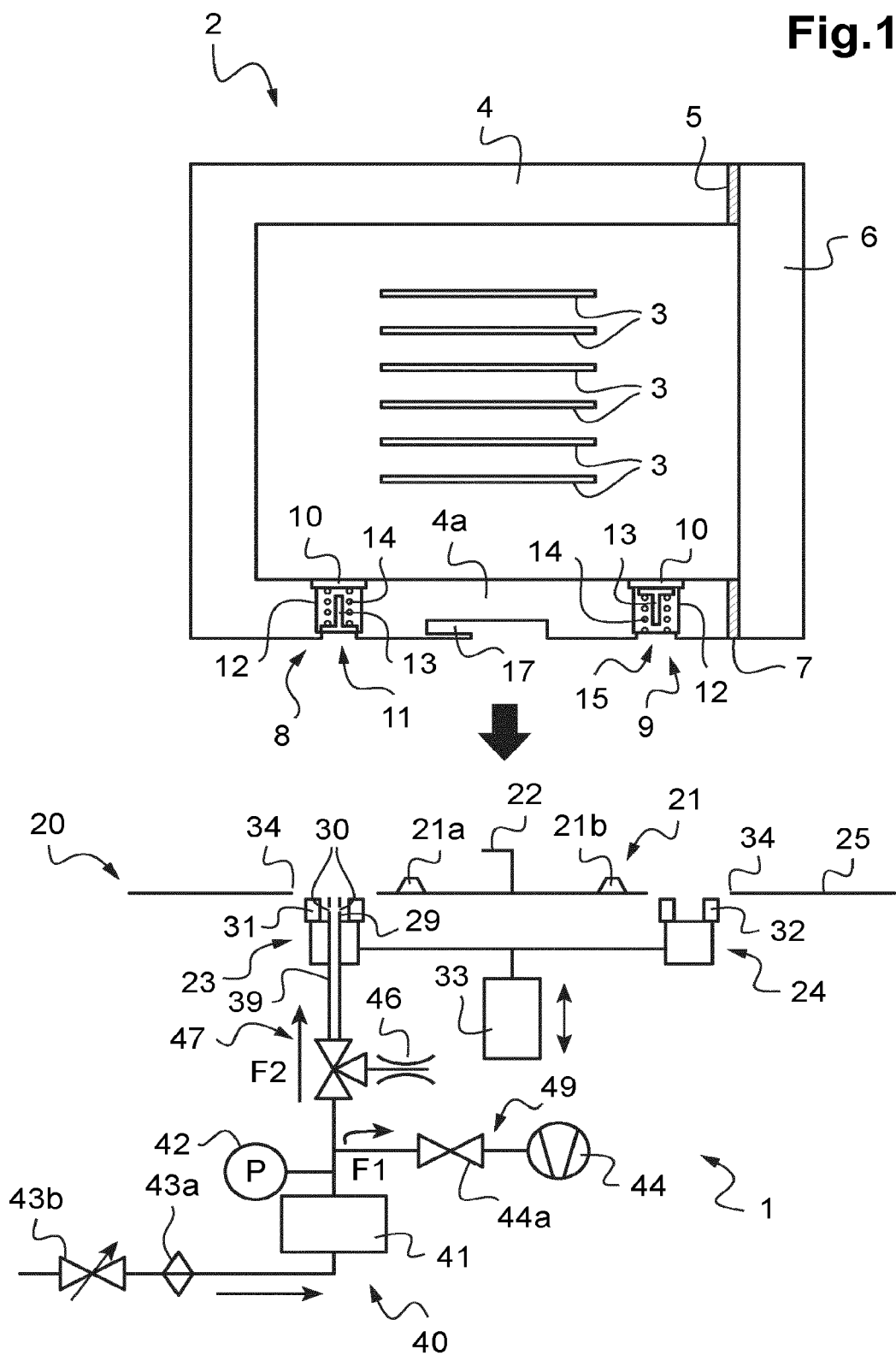

coupled to the connecting head of the interface. There is also provided a method for controlling the tightness of the transport enclosure.

18 Claims, 5 Drawing Sheets

(52) U.S. Cl.
CPC .... *H01L 21/67379* (2013.01); *H01L 21/6732* (2013.01); *H01L 21/67386* (2013.01)

(56) References Cited

U.S. PATENT DOCUMENTS

| | | | |
|---|---|---|---|
| 9,174,253 B2* | 11/2015 | Natsume | H01L 21/67393 |
| 2016/0276189 A1* | 9/2016 | Igarashi | H01L 21/67775 |

FOREIGN PATENT DOCUMENTS

| | | |
|---|---|---|
| JP | 2010-147451 A | 7/2010 |
| JP | 2012-164948 A | 8/2012 |
| JP | 2016-178239 A | 10/2016 |
| TW | 201010916 A | 3/2010 |
| TW | M456581 U1 | 7/2013 |
| WO | WO 2012/108418 A1 | 8/2012 |

OTHER PUBLICATIONS

International Search Report dated Feb. 7, 2018, in PCT/EP2017/078367 filed on Nov. 6, 2017.
Combined Taiwanese Office Action and Search Report dated Apr. 30, 2021 in Taiwanese Patent Application No. 106137250 (with English translation), 11 pages.

* cited by examiner

DEVICE AND METHOD FOR CONTROLLING THE TIGHTNESS OF A TRANSPORT ENCLOSURE FOR THE CONVEYANCE AND ATMOSPHERIC STORAGE OF SEMICONDUCTOR SUBSTRATES

The present invention relates to a device for controlling the tightness of at least one transport enclosure for the conveyance and atmospheric storage of semiconductor substrates. The present invention also relates to a method for controlling the tightness of at least one transport enclosure.

In the semiconductor manufacturing industry, transport enclosures such as FOUPs (Front Opening Unified Pods) may be used to transport substrates such as semiconductor wafers from one apparatus to another, or to store the substrates between two manufacturing steps. These transport enclosures provide a confined space at atmospheric pressure, separated from the environment where the substrate is used and transported, for the transport and storage of one or more substrates in white rooms, in which the internal atmosphere is kept at a very low level of contamination. These transport enclosures are standardized elements whose opening and closing may be automatically and directly controlled by the manufacturing equipment.

Each transport enclosure comprises a rigid peripheral casing having an opening that can be closed by a removable door, a door seal being interposed between the door and the casing. However, the transport enclosure is not totally sealed, because ventilation ports ("breathing ports") are formed in the casing or the door to allow pressure balancing between the inside and the outside of the enclosure.

To achieve a further reduction in the risks of contamination inside these enclosures, it is currently recommended that the internal atmosphere of these enclosures be regularly purged.

Recent developments also provide for the arrangement of check valves in the ventilation ports of some transport enclosures, the check valves being fitted in series with filters. The check valves enable the enclosures to be closed in a virtually sealed way in order to maintain a slight overpressure of the purge gas in the internal atmosphere of the enclosures, without any exchange of gas with the outside.

This increase in the degree of tightness at the ventilation ports means that the level of tightness of the door is a decisive factor. This is because, if the tightness of the door is not ensured, unfiltered gas may enter the transport enclosure, and this is particularly harmful for the substrates. In fact, measurements have established a correlation between the level of tightness of the door of the transport enclosure and the level of contamination with particles of the substrates contained in these enclosures. The level of tightness of the door is therefore directly related to production efficiency. However, there is no existing means for controlling the tightness of the door of a transport enclosure in an automatic way which would enable the tightness to be controlled in the course of production.

One of the objects of the present invention is therefore to propose a device for controlling the tightness of at least one transport enclosure for the conveyance and atmospheric storage of semiconductor substrates, which can be automated to provide fast and reliable controlling of tightness in the course of production.

For this purpose, the invention proposes a device for controlling the tightness of at least one transport enclosure for the conveyance and atmospheric storage of semiconductor substrates, said transport enclosure comprising:
 a rigid casing having an opening,
 a removable door for closing the opening, and
 at least two ventilation ports,
 characterized in that the control device comprises at least one interface configured to be coupled to the transport enclosure, the interface comprising
  at least two connecting heads, at least one connecting head being formed by a measurement head configured to engage in a ventilation port of the transport enclosure, the measurement head comprising:
   a projecting end piece, opening through at least one aperture,
   a peripheral sealing element surrounding the end piece,
  all the ventilation ports of the transport enclosure being coupled to a connecting head of the interface.

Thus the control device may be used to control the tightness of the door of the enclosure by accessing the internal atmosphere of the transport enclosure from outside the latter, in a sealed way and without modification of the enclosure, which remains a standard type. The tightness of the closure of the transport enclosure may therefore be controlled in the course of production, in a fully automated way, while the enclosure contains semiconductor substrates.

The tightness may therefore be controlled in a few minutes, less than five minutes for example, for a range of leaks with a conductance of 0.01 l/s to several l/s, the conductance being the ratio of the leak flow rate to the pressure difference generating the leak. The measurement head may be configured to engage in a ventilation port of the transport enclosure, pushing back the inlet check valve if the ventilation port is equipped with an inlet check valve. Thus the measurement head may be used to connect a measurement line to a ventilation port of the transport enclosure by opening any check valves that may be present on the transport enclosure. The fact that the inlet check valves are kept open by the measurement heads makes it possible, notably, to inject controlled gas flows into the transport enclosure, without being subject to the variability of the resilient members of the valves which could increase the measurement uncertainty, given that the stiffness of the resilient members may show large discrepancies from one transport enclosure to another. The fact that the valves are kept open also makes it possible to avoid the effects of vibration of the valves if they enter an unstable state between the open position and the closed position.

At least one connecting head may be formed by an obstructing head comprising a blind sealing element configured to close a ventilation port of the transport enclosure, all the ventilation ports of the transport enclosure being either engaged by a measurement head or closed by an obstructing head.

Thus all possible leaks of gas other than those located between the door and the casing of the transport enclosure are controlled, that is to say they are either obstructed or connected to a measurement head, so that the control of the tightness of the transport enclosure reflects only the control of the tightness of the closure of the enclosure door.

According to one or more characteristics of the control device, considered individually or in combination:
 the at least one peripheral sealing element is resilient and at least partially compressed or deformed when the transport enclosure is coupled to the interface,
 the at least one blind sealing element is resilient and at least partially compressed or deformed when the transport enclosure is coupled to the interface, the interface comprises at least one securing means configured for securing the transport enclosure, the interface comprises a positioning means configured for positioning and supporting the transport enclosure, the positioning means comprises three centring pins projecting from the plate of the interface, the centring pins are configured to engage in three complementary cavities formed in the bottom of the transport enclosure, the connecting heads are movable, the interface further comprises at least one head actuator configured to move the connecting heads between a withdrawn position and a projecting position for controlling the tightness, the stroke of the head actuator is more than 0.5 mm, the connecting heads are fixed and project from the interface, the peripheral and blind sealing elements in the uncompressed or undeformed state project from a plate of the interface beyond the end of the positioning means, the at least one peripheral sealing element and/or the blind sealing element comprises a suction cup, a ring seal, a lip seal or a bellows, the interface comprises two measurement heads and two obstructing heads, the control device comprises at least one measurement line connected to an end piece of a measurement head, the measurement line comprising a flow rate control device and/or a pressure sensor, the measurement line comprises at least one calibrated self-controlling aperture fitted as a branch from the measurement head and a three-way valve for putting the flow rate control device and the pressure sensor of the measurement line into communication with the at least one calibrated self-controlling aperture while being isolated from the measurement head, the control device comprises a sampling line connected to the end piece of a measurement head, the sampling line comprising a sampling pump, the control device comprises a calibration line connected to the end piece of a measurement head, the calibration line comprising at least one calibrated calibration aperture.

The invention also proposes a method for controlling the tightness of at least one transport enclosure for the conveyance and atmospheric storage of semiconductor substrates by means of a control device as described above, wherein a transport enclosure is coupled to an interface of the control device so that all the ventilation ports of the transport enclosure are coupled to a connecting head of the interface, at least one connecting head being formed by a measurement head engaged in a ventilation port of the transport enclosure.

According to an embodiment, all the ventilation ports of the transport enclosure are either engaged by a measurement head or closed by an obstructing head of the interface, at least one connecting head formed by an obstructing head closing a ventilation port of the transport enclosure.

According to one or more characteristics of the control method, considered individually or in combination:

the at least one peripheral sealing element is at least partially compressed or deformed when the transport enclosure is coupled to the interface, the at least one blind sealing element is at least partially compressed or deformed when the transport enclosure is coupled to the interface, a controlled flow of gas is injected into a measurement line connected to a measurement head engaged in a ventilation port of the transport enclosure coupled to the interface, after which the injection is stopped and the pressure drop in the measurement line is measured, a constant flow of gas is injected into a measurement line connected to a measurement head engaged in a ventilation port of the transport enclosure coupled to the interface, while the change in pressure over time in the measurement line is measured, the control method comprises a preliminary conditioning step in which a predetermined initial pressure is established in a measurement line connected to a measurement head engaged in a ventilation port of the transport enclosure coupled to the interface, the control method comprises a calibration step in which a calibration line is connected to the transport enclosure by a measurement head engaged in a ventilation port of the transport enclosure coupled to the interface to generate a calibrated leak, and the pressure is measured in a measurement line connected to a measurement head engaged in a ventilation port of the transport enclosure coupled to the interface, the control method comprises a self-controlling step in which the pressure is measured in a measurement line comprising a calibrated self-controlling aperture fitted as a branch from the measurement head, the calibrated self-controlling aperture being put into communication with the flow rate control device and the pressure sensor of the measurement line, while being isolated from the measurement head.

Figure 2A:
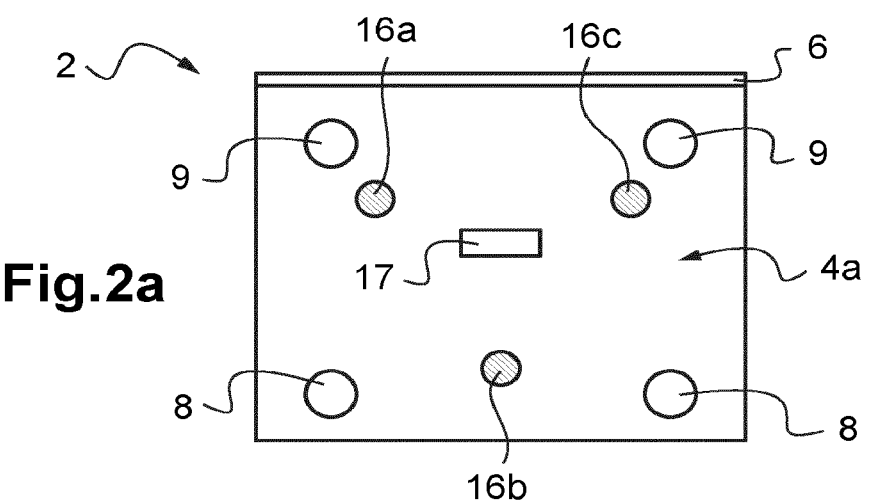
Figure 2B:
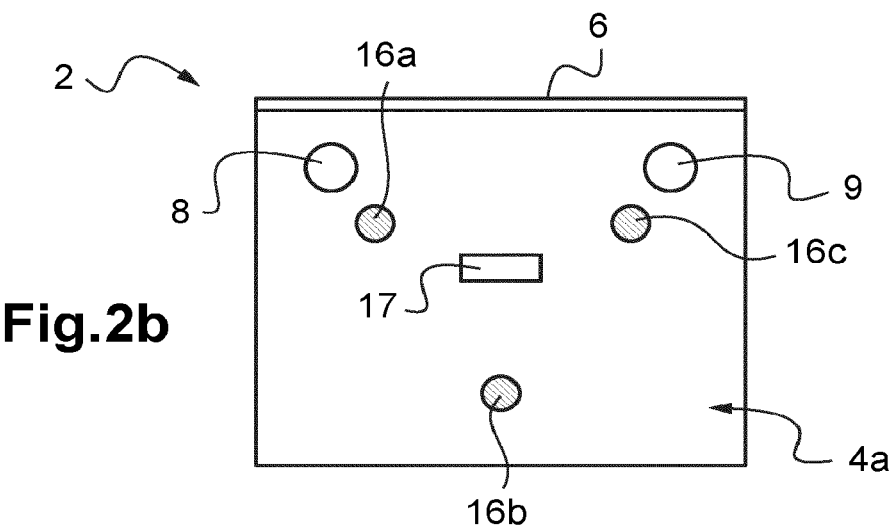
Figure 2C:
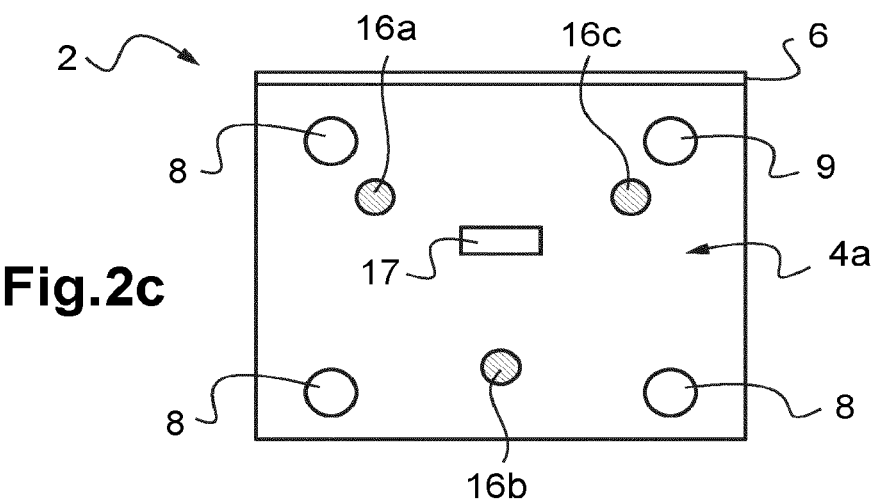
Figure 3A:
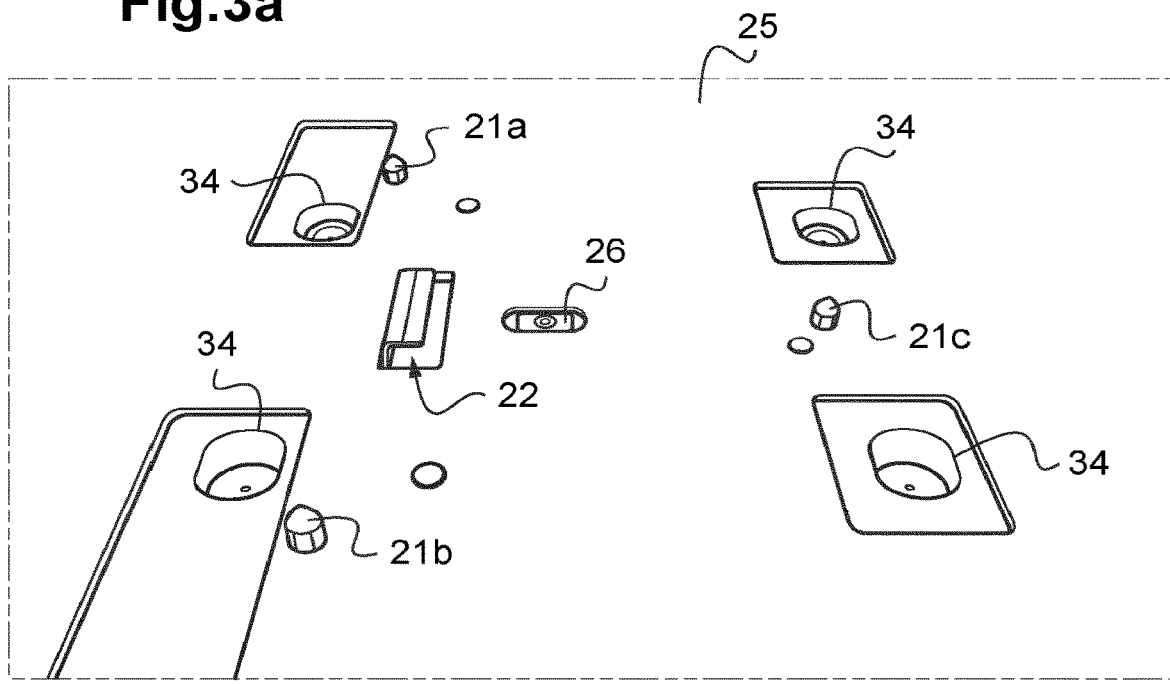
Figure 3B:
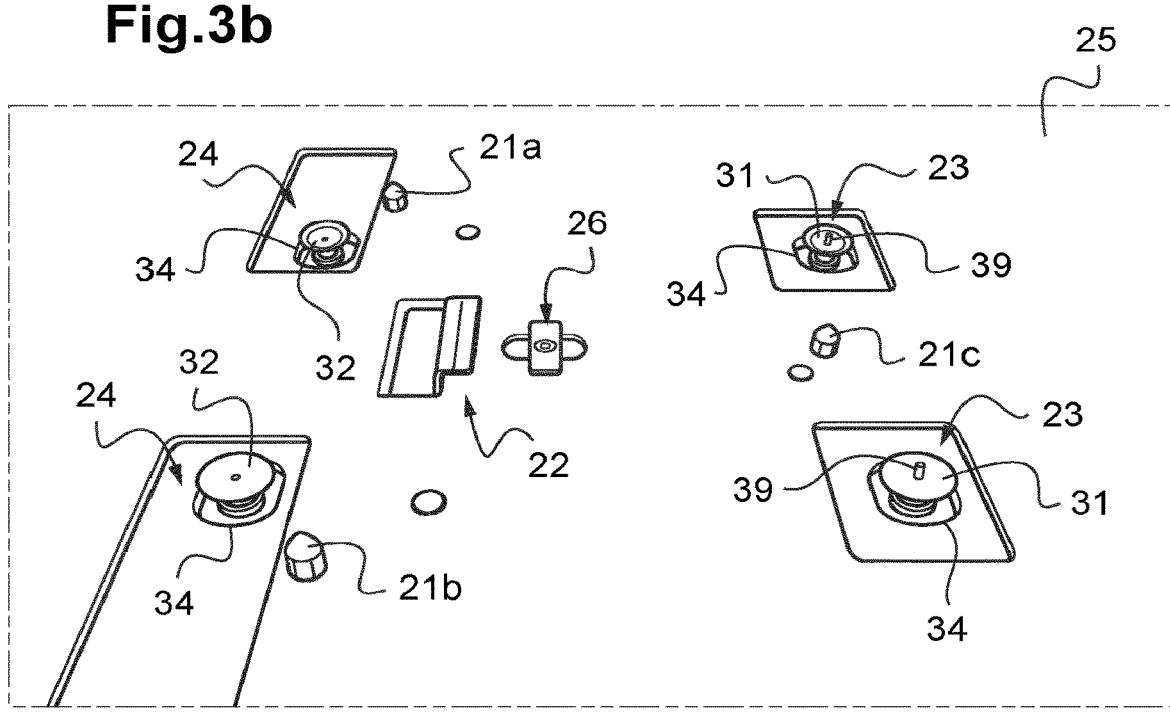
Figure 4:
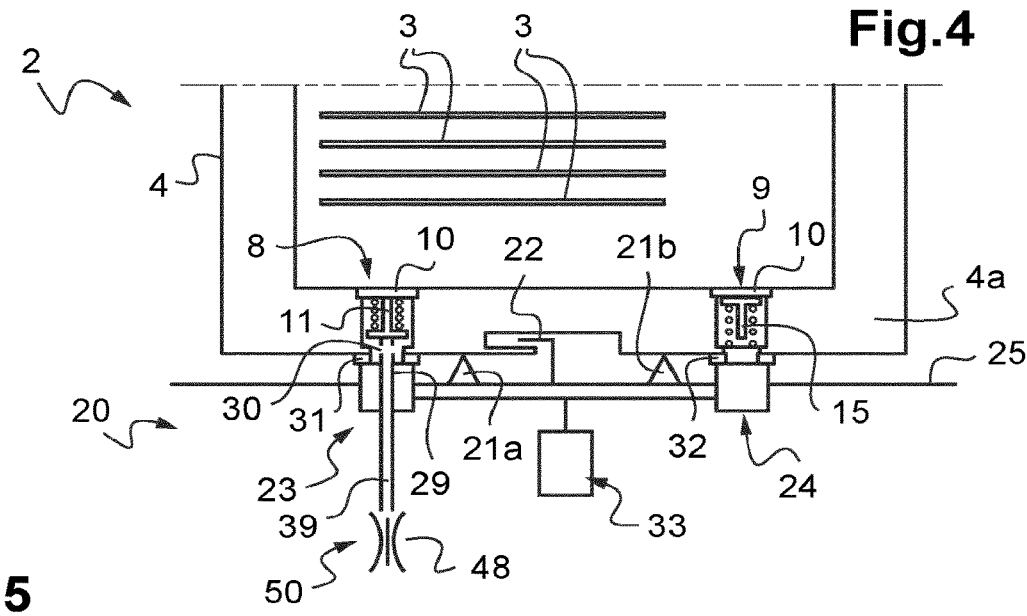
Figure 5:
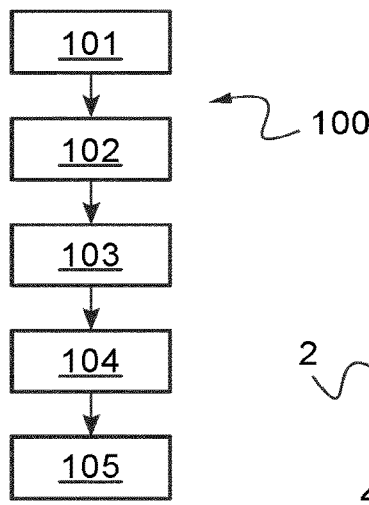
Figure 6:
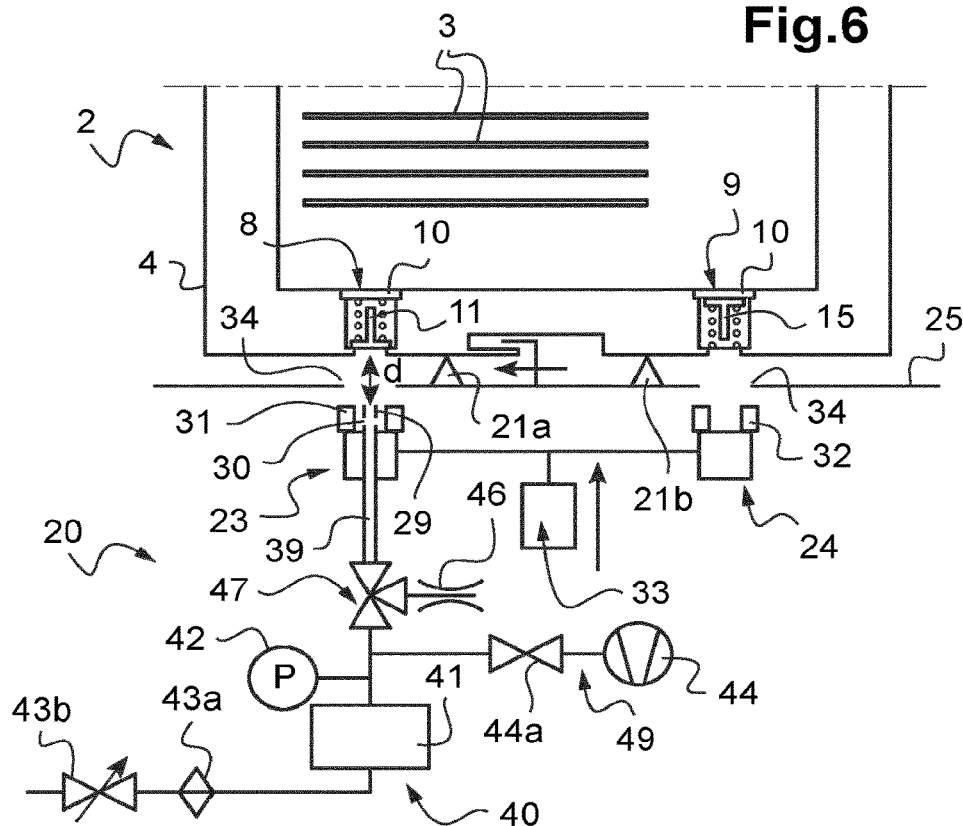
Figure 7:
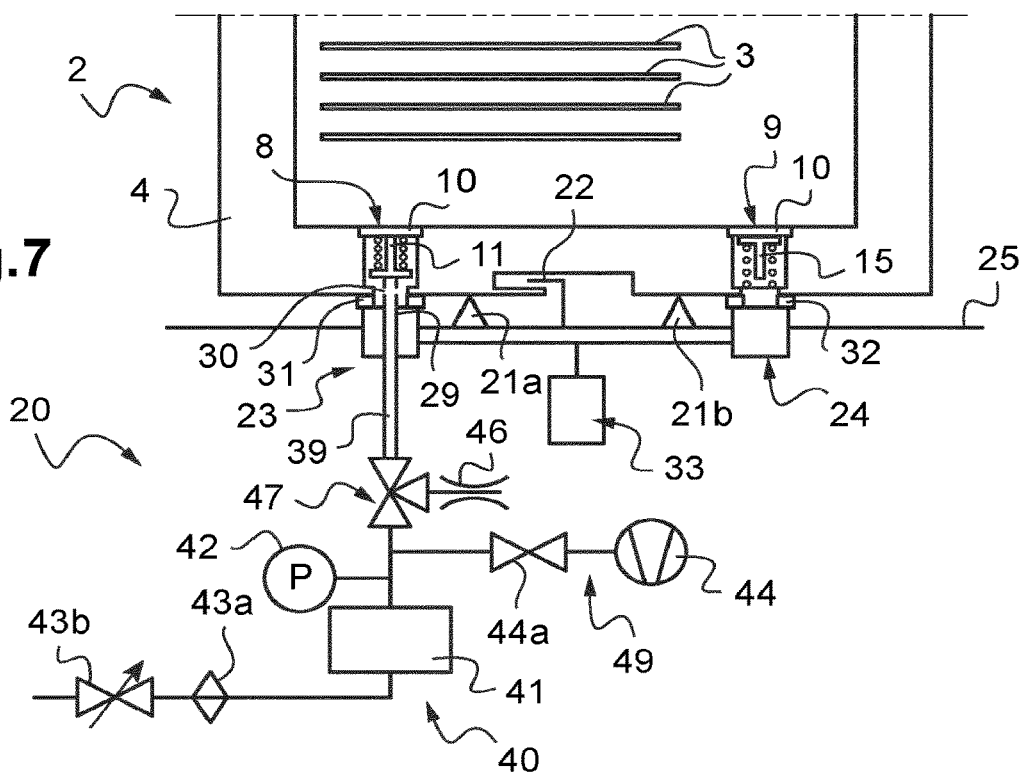
Figure 8:
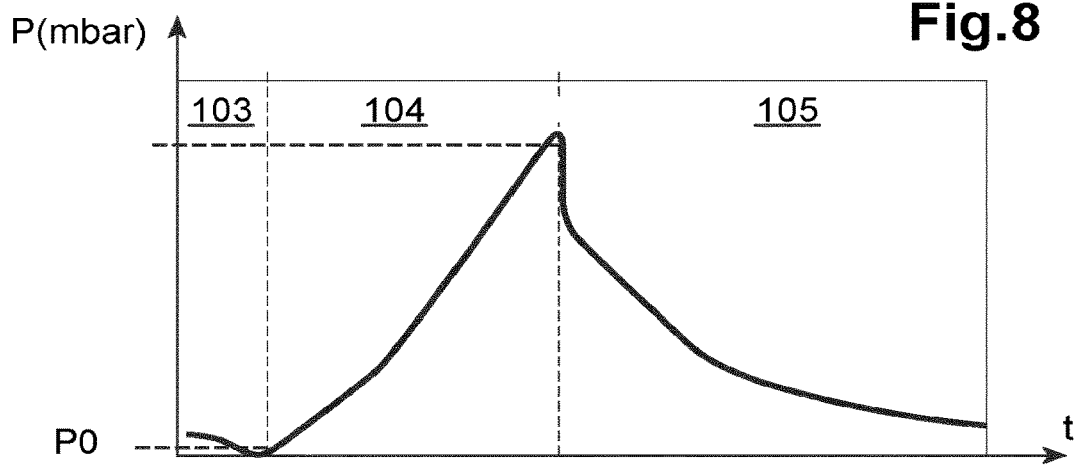
Figure 9:
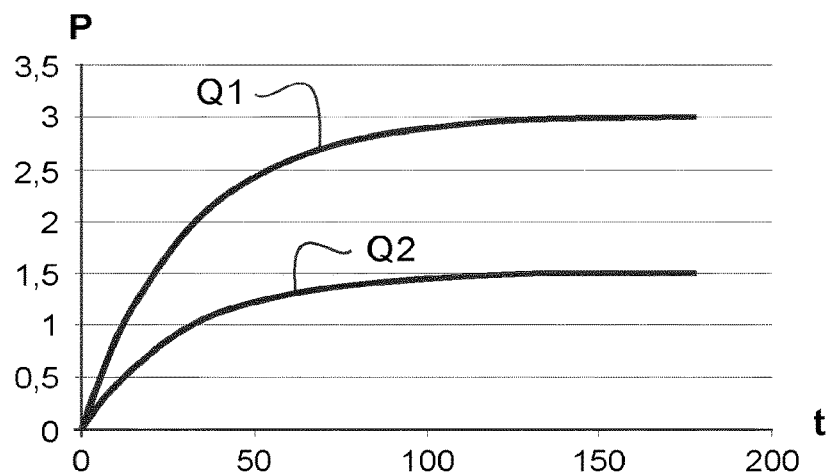

Other characteristics and advantages of the invention will be apparent from the following description, provided by way of non-limiting example, with reference to the attached drawings, in which:

FIG. 1 shows a schematic sectional side view of an example of a transport enclosure having inlet and outlet check valves represented in the closed position, together with a device for controlling the tightness of the transport enclosure, FIG. 2a is a schematic view of a bottom of the casing of the transport enclosure of FIG. 1, FIG. 2b is a schematic view of another example of a bottom of a transport enclosure, FIG. 2c is a schematic view of another example of a bottom of a transport enclosure, FIG. 3a shows a view, substantially from above, of the interface of the control device of FIG. 1 in the withdrawn position, FIG. 3b is a view similar to FIG. 3a, with two measurement heads and two obstructing heads of the interface in a projecting position, FIG. 4 is a view similar to FIG. 1, showing a calibration line of the interface, FIG. 5 shows different steps of a method for controlling the tightness of a transport enclosure, FIG. 6 is a view similar to FIG. 1, showing the transport enclosure positioned and held on the interface, FIG. 7 is a view similar to FIG. 6, showing the transport enclosure coupled to the interface, FIG. 8 is a graph showing the variation in pressure over time for a tightness control performed according to the method of FIG. 5, and FIG. 9 is a graph showing the variation in pressure over time for a two constant and different injections of gas flows in the course of a tightness control performed according to another method.

In these figures, identical elements have the same reference numerals. The following embodiments are examples.

Although the description refers to one or more embodiments, this does not necessarily mean that each reference concerns the same embodiment, or that the characteristics are applicable to a single embodiment only. Simple characteristics of different embodiments may also be combined or interchanged to provide other embodiments.

FIG. 1 shows a schematic sectional side view of an example of a device 1 for controlling the tightness of at least one transport enclosure 2.

The transport enclosure 2 allows the conveyance and storage of at least one semiconductor substrate 3, such as "wafers", or photomasks, between the steps of semiconductor manufacture. The internal atmosphere of the transport enclosures 2 is at atmospheric pressure of air or nitrogen. The enclosures in question are, for example, standard lateral opening boxes of the FOUP type (Front Opening Unified Pod) or standard lateral opening boxes of the MAC type (Multi Application Carrier) or bottom opening boxes of the SMIF type (Standard Mechanical InterFace) or transport boxes for photomasks of the RSP type (Reticle SMIF Pod).

The transport enclosure 2 comprises a rigid casing 4 of plastic material, having an opening 5 and a removable door 6 having a peripheral seal 7, the removable door 6 enabling the opening 5 to be closed. The opening 5 may be lateral (FIG. 1) or on the bottom.

The transport enclosure 2 comprises at least two ventilation ports 8, 9, each ventilation port 8, 9 comprising an aperture 12 formed in the bottom 4a of the enclosure 4 in the case of a lateral opening enclosure, or formed in the door 6 in the case of a bottom opening enclosure.

Each ventilation port 8, 9 comprises a particle filter 10 arranged in the aperture 12, preventing the ingress of particles into the transport enclosure 2.

The ventilation ports 8, 9 may simply be formed by an aperture 12 equipped with a filter 10, the flow of gas being able to enter and leave simultaneously and in the same manner in each ventilation port of the enclosure 2.

Other examples of transport enclosures 2 have at least one ventilation port 8 comprising an inlet check valve 11 (referred to below as an "inlet port") and at least one ventilation port 9 comprising an outlet check valve 15 (referred to below as an "outlet port"). The valves 11, 15 are each arranged in a respective aperture 12, upstream or downstream of the filter 10.

The outlet check valves 15 open if there is an excess of gas inside the transport enclosure 2 relative to the external atmospheric pressure; conversely, the inlet check valves 11 open if there is a negative pressure inside the enclosure 2.

A purge gas may be injected into the transport enclosure 2 at an inlet check valve 11, the excess air being discharged via an outlet check valve 15. Thus the internal atmosphere of the transport enclosure 2 may be purged without opening and without modifying the enclosure 2, that is to say in the course of production.

The transport enclosure 2 comprises, for example, two inlet ports 8 and two outlet ports 9 (FIG. 2a). The four inlet and outlet ports 8, 9 may be arranged at the four corners of the bottom 4a of the casing 4 of the enclosure 2. For a transport enclosure 2 with a lateral opening 5, the outlet ports 9 are, for example, located at the nearest corners of the door 6.

Other embodiments are feasible. For example, for a transport enclosure 2 with a lateral opening 5, the transport enclosure 2 may comprise a single inlet port 8 and a single outlet port 9, which are, for example, located at the two corners of the bottom 4a near the door 6 (FIG. 2b). According to another example, the transport enclosure 2 comprises three inlet ports 8 and a single outlet port 9, the outlet port 9 being, for example, arranged in a corner near the door 6.

According to an example of embodiment, the inlet check valve 11 comprises a movable shutter 13 and a resilient member 14 (FIG. 1). The shutter 13 is movable between an open position and a closed position in which it closes the aperture 12. It comprises, for example, a disc which is complementary to a cylindrical bearing part of the aperture 12. The resilient member 14, such as a compression spring, biases the movable shutter 13 into a closed position.

The opening of the inlet check valve 11 allows a gas to enter the transport enclosure 2 under the application of a force external to the transport enclosure 2, the position of the valve being determined by the pressure difference between the upstream and downstream ends of the valve. If the pressure difference between the external pressure and the internal pressure of the transport enclosure 2 is greater than a set threshold of the valve, the movable shutter 13 moves in opposition to the resilient member 14 into the open position, and gas can enter the transport enclosure 2.

The outlet port 9 differs from the inlet port 8 in that its aperture allows the discharge of a gas from the transport enclosure 2, the outlet check valve 15 opening under the application of a force exerted inside the transport enclosure 2. Thus, if the pressure difference between the internal pressure and the external pressure of the transport enclosure 2 is greater than a set threshold of the valve, the movable shutter 13 moves in opposition to the resilient member 14 into the open position, and gas can leave the transport enclosure 2.

The apertures 12 and the filters 10 of the at least one inlet port 8 and the at least one outlet port 9 may be identical. The movable shutters 13 and the resilient members 14 of the inlet check valve 11 and the outlet check valve 15 may also be the same as one another, the movable shutter 13 of the inlet check valve 11 being arranged in an inverted position relative to the movable shutter 13 of the outlet check valve 15.

The device 1 for controlling the tightness of at least one transport enclosure 2 comprises at least one interface 20 configured to be coupled to the transport enclosure 2.

The interface 20 comprises at least two connecting heads, at least one of which is a measurement head 23 configured to engage in an aperture 12 of a ventilation port 8 of the transport enclosure 2. The connecting heads may all be measurement heads 23.

At least one connecting head may be formed by an obstructing head 24. The interface 20 then comprises at least one measurement head 23 and at least one obstructing head 24.

The measurement head 23 comprises a projecting end piece 29, opening through at least one aperture 30, together with a peripheral sealing element 31 surrounding the end piece 29, for example upstream of the at least one aperture 30. The at least one aperture 30 is interposed between the end of the end piece 29 and the peripheral sealing element 31.

The end piece 29 is rigid. It is, for example, a tube, made of metallic material for example. It projects in an axial direction, intended to be perpendicular to the wall of the transport enclosure 2 coupled to the interface 20. Two apertures 30 open, for example, laterally from the end of the end piece 29, the apertures 30 being, for example, diametrically opposed.

The peripheral sealing element 31 allows a sealed flow of gases between the end piece 29 and the ventilation port 8 of the transport enclosure 2 coupled to it, via the at least one aperture 30.

The peripheral sealing element 31 is, for example, made of resilient material such as silicone. It is, for example, a suction cup (FIG. 3b), a ring seal, a lip seal or a bellows. The suction cup makes it possible to obtain very good tightness in a simple manner, as the weight of the transport enclosure 2 may be sufficient to deform the suction cup projecting from a horizontal plate 25.

The peripheral sealing element 31 may also be made of rigid material, such as PEEK material, the tightness possibly being provided by compression of the resilient member 14, in the case where the inlet port 8 comprises an inlet check valve 11.

The measurement head 23 is configured to engage in an aperture 12 of a ventilation port 8 of the transport enclosure 2, notably while pushing back the movable shutter 13 of the inlet check valve 11 if the ventilation port 8 is equipped with an inlet check valve 11, and, for example, while compressing or at least partially deforming the peripheral sealing element 31.

Thus, when the measurement head 23 is engaged in a ventilation port 8 of the enclosure 2 equipped with an inlet check valve 11, the end of the rigid end piece 29 bears on the movable shutter 13 to push it back.

Thus the measurement head 23 may be used to connect a measurement line 40 to a ventilation port 8 of the transport enclosure 2 in a sealed way and by opening any inlet check valves 11 that may be present.

The obstructing head 24 comprises a blind sealing element 32 configured to be at least partially compressed or deformed to close a ventilation port 9 of the transport enclosure 2 when the transport enclosure 2 is coupled to the interface 20.

The blind sealing element 32 is, for example, made at least partially of resilient material such as silicone. It is, for example, a suction cup (FIG. 3b), a ring seal, a lip seal or a bellows.

The interface 20 may comprise a plurality of measurement heads 23 and may comprise a plurality of obstructing heads 24.

Thus, in the first example illustrated in FIG. 1 and in FIG. 2a where the transport enclosure 2 comprises two inlet ports 8 and two outlet ports 9, the interface 20 comprises two measurement heads 23 and two obstructing heads 24 (FIGS. 3a and 3b), one measurement head 23 being configured to engage in a respective inlet port 8 and one obstructing head 24 being configured to close a respective outlet port 9.

Additionally, when the transport enclosure 2 is coupled to the interface 20, all the ventilation ports 8, 9 of the transport enclosure 2 are coupled to the interface 20. The ventilation ports 8, 9 are either engaged by a measurement head 23 or closed by an obstructing head 24, at least one measurement head 23 being engaged in a ventilation port 8. In the coupled state, the peripheral and blind sealing elements 31, 32 may be at least partially compressed or deformed.

Thus all possible leaks of gas other than those located between the door 6 and the casing 4 are controlled, that is to say they are either obstructed or connected to a measurement head 23, so that the control of the tightness of the transport enclosure 2 reflects only the control of the tightness of the closure of the door 6 of the enclosure 2.

Additionally, the measurement heads 23 enable any inlet check valves 11 that may be present to be kept in the open position, allowing access to the inside of the transport enclosure 2, without modification and without opening the enclosure, throughout the duration of a tightness control.

The interface 20 may also comprise a positioning means 21, configured for positioning and supporting the transport enclosure 2.

The positioning means 21 comprises, for example, three centring pins 21a, 21b, 21c projecting from the plate 25 of the interface 20 (FIG. 3b). The centring pins 21a, 21b, 21c are configured to engage in three complementary cavities 16a, 16b, 16c formed in the bottom 4a of the transport enclosure 2 (FIG. 2a) so as to position and support the transport enclosure 2. This forms a positioning means according to the SEMI standard. In automatic operation, a transport enclosure 2 may be fitted on an interface 20 by lowering the transport enclosure 2 on to the centring pins 21a, 21b, 21c, the contact of the transport enclosure 2 with the pins 21a, 21b, 21c stopping the descent of the transport enclosure 2.

The interface 20 may also comprise at least one securing means configured for securing the transport enclosure 2.

The securing means comprises, for example, a securing finger 22 that is movable between a standby position (FIG. 3a) and a securing position (FIG. 3b) in which the finger 22 secures the transport enclosure 2. The securing finger 22 is, for example, movable in translation. It is capable of engaging in a retaining cavity 17 of complementary shape formed in the bottom 4a of the transport enclosure 2 (FIG. 2a) in the securing position for axially retaining the transport enclosure 2.

The interface 20 may comprise different standardized securing means so that different types of transport enclosures 2, in this case of the lateral opening type, can be held.

The interface 20 may comprise a securing means comprising a locking key 26 that is movable between a standby position (FIG. 3a) and a securing position (FIG. 3b) in which the key 26 secures the transport enclosure 2. The locking key 26 is axially movable and is capable of pivoting through 90° into the securing position, in order to engage in a complementary retaining cavity formed in the bottom 4a of the transport enclosure 2.

According to an example of embodiment, the at least one measurement head 23 and the at least one obstructing head 24 are fixed and project from a plate 25 of the interface 20. Thus the positioning of the transport enclosure 2 on the at least one measurement head 23 and obstructing head 24 enables the transport enclosure 2 to be positioned and coupled to the interface 20 by engaging the at least one measurement head 23 in a ventilation port 8 and by obstructing at least one ventilation port 9 with an obstructing head 24.

If the interface 20 comprises a positioning means 21 and a securing means 22, and if the peripheral and blind sealing elements 31, 32 are resilient, the peripheral and blind sealing elements 31, 32 in the uncompressed or undeformed state may project from the interface 20 slightly beyond the end of the positioning means 21. Thus the positioning and securing of the transport enclosure 2 coupled to the interface 20 enable at least one measurement head 23 to be engaged in a ventilation port 8 and enable at least one ventilation port 9 to be obstructed with an obstructing head 24.

According to another example of embodiment, the control device 1 comprises at least one head actuator 33, such as a jack, configured to move the at least one measurement head 23 and the at least one obstructing head 24 between a withdrawn position (FIG. 3a) and a projecting position for controlling the tightness (FIG. 3b). In this case, the interface 20 preferably comprises a securing means 22 for securing the transport enclosure 2 at the time of the movement of the actuator 33.

The stroke d of the head actuator 33 depends on the position of the peripheral and blind sealing elements 31, 32 in the withdrawn position. These elements may be flush with the holes 34 formed in the plate 25 of the interface 20, or may be located below the plate 25 or may extend beyond the plate 25, in the withdrawn position.

For example, the stroke d of the actuator 33 may be made to be greater than 0.5 m (FIG. 6), thereby enabling the peripheral and blind sealing elements 31, 32, which are flush with the plate 25 in the withdrawn position, to be moved beyond the positioning means 21 so as to at least partially open the inlet check valves 11 regardless of the stiffness of the resilient members 14, possibly while at least partially compressing or deforming the peripheral and blind sealing elements 31, 32.

The control device 1 may comprise at least one measurement line 40 connected to an end piece 29 of a measurement head 23. The measurement line 40 comprises a flow rate control device 41 and/or a pressure sensor 42.

The flow rate control device 41 is, for example, an adjustable mass flow meter. It may be used for the controlled injection of different gas flows, within the range from 0 sccm-2000 sccm for example, in a pipe 39 of the measurement line 40 opening on the end piece 29 of the measurement head 23.

The pressure sensor 42 is, for example, capable of measuring pressure of between 0 and 10 mbar in the pipe 39.

The flow rate control device 41 is, for example, interposed between the end piece 29 and a particle filter 43a arranged downstream of an adjustable pressure reducer 43b, which is itself arranged downstream of a source of purge gas, in the direction of flow of the gases from the gas source towards the flow rate control device 41.

The flow rate control device 41 and the pressure sensor 42 may be arranged on the same measurement line 40 (FIG. 1). If the control device 1 comprises two measurement heads 23, the flow rate control device 41 may be fitted on a first measurement line 40 connected to a first end piece 29, and the pressure sensor 42 may be fitted on a second measurement line 40 connected to a second end piece 29. In both of these cases, the measurement line 40 equipped with the flow rate control device 41 and/or the pressure sensor 42 is connected to a measurement head 23 intended to be engaged in a ventilation port without a valve or an inlet port 8 having an inlet check valve 11.

The control device 1 may comprise a sampling line 49 connected to the end piece 29 of a measurement head 23 to reduce the pressure in the pipe connected to the measurement head 23.

The sampling line 49 comprises a sampling pump 44, such as a small membrane pump, and an isolation valve 44a. The sampling pump 44 is fitted downstream of the isolation valve 44a in the direction of flow of the gases, so that the sampling pump 44 can be isolated from the measurement head 23.

The sampling line 49 may be fitted as a branch from a measurement line 40 comprising a flow rate control device 41 and/or a pressure sensor 42. It may also be a separate line. The sampling line 49 equipped with a sampling pump 44 may be connected to a measurement head 23 intended to be engaged in a ventilation port without a valve or in an inlet port 8 having an inlet check valve 11 or in an outlet port 9 having an outlet check valve 15.

The sampling pump 44 may be used to facilitate the control of pressure in the transport enclosure 2, notably by allowing a desired pressure to be established more quickly during a control of the tightness of the enclosure 2.

The measurement line 40 may also comprise at least one calibrated self-controlling aperture 46 fitted as a branch from the measurement head 23, together with a three-way valve 47. The calibrated self-controlling aperture 46 may comprise a particle filter.

The three-way valve 47 is capable of putting the flow rate control device 41 and the pressure sensor 42, and the sampling line 49 if present, into communication with the calibrated self-controlling aperture 46 while they are isolated from the measurement head 23, for the purpose of controlling the measurement line 40 (arrow F1 in FIG. 1).

The three-way valve 47 is also capable of putting the flow rate control device 41 and the pressure sensor 42, and the sampling line 49 if present, into communication with the measurement head 23 while they are isolated from the calibrated self-controlling aperture 46, for the purpose of controlling the tightness of the transport enclosure 2 (arrow F2 in FIG. 1).

The control device 1 may comprise a calibration line 50 connected to an end piece 29 of a measurement head 23, the calibration line 50 comprising at least one calibrated calibration aperture 48 (FIG. 4). The calibrated calibration aperture 48 may comprise a particle filter.

The calibration line 50 may be fitted as a branch from a measurement line 40 comprising a flow rate control device 41 and/or a pressure sensor 42, the calibrated calibration aperture 48 then being fitted upstream of a valve. It may also be a separate line, for example a line which also comprises a sampling line 49. In this case, the measurement head 23 may be equipped with a dedicated head actuator 33, for moving the measurement head 23 into a projecting position only during a calibration step.

This sampling line 50 equipped with a calibrated calibration aperture 48 may be connected to a measurement head 23 intended to be engaged in a ventilation port without a valve or in an inlet port 8 having an inlet check valve 11, to ensure that the valve remains open during the calibration.

Thus the calibration line 50 may be used to generate a calibrated leak in the transport enclosure 2 for the calibration of the control device 1.

The control device 1 may comprise a plurality of interfaces 20 for the simultaneous control of the tightness of a plurality of transport enclosures 2, each coupled to a respective interface 20.

A description will now given of an example of a method 100 for controlling the tightness of a transport enclosure 2 (FIG. 5) by means of a control device 1 comprising, for example, two measurement heads 23 and two obstructing heads 24, the control device 10 further comprising a head actuator 33.

The control method 100 may comprise a self-controlling step 101, in which the pressure is measured in the measurement line 40, which is connected to a calibrated leak while being isolated from the measurement head 23.

For this purpose, the flow rate control device 41 and the pressure sensor 42 of a measurement line 40, and the sampling pump 44 if present, are put into communication with the calibrated self-controlling aperture 46 while they are isolated from the measurement head 23 (arrow F1 in FIG. 1).

The self-controlling step 101 of the measurement line 40 may be executed at any time, with or without the transport enclosure 2 coupled. It makes it possible to verify the correct operation of the control device 1, thus avoiding errors in the interpretation of the pressure measurements.

The following steps of the control method 100 require the coupling of a transport enclosure 2 to the interface 20.

For this purpose, for example, the transport enclosure 2 is initially positioned on the centring pins 21a, 21b, 21c, the securing finger 22 being in the standby position and the measurement heads 23 and the obstructing heads 24 being in the withdrawn position (FIG. 3a).

The securing finger 22 is then made to move into the securing position to secure the transport enclosure 2 (FIGS. 3b and 6).

The head actuator 33 is then operated to move the measurement heads 23 and the obstructing heads 24 into the projecting position for controlling the tightness (FIG. 3b, 7).

The engagement of each of the measurement heads 23 in an aperture 12 of a respective ventilation port 8 of the transport enclosure 2 pushes back the movable shutters 13 of the inlet check valves 11 and at least partially deforms the peripheral sealing elements 31.

The blind sealing elements 32 of the obstructing heads 24 are also at least partially deformed, and each of them closes a respective ventilation port 9 of the transport enclosure 2.

The transport enclosure 2 is then coupled to the interface 20.

The inlet ports 8 and the outlet ports 9 of the transport enclosure 2 are either engaged by a measurement head 23 or closed by an obstructing head 24, at least one measurement head 23 being engaged in a ventilation port 8, the peripheral and blind sealing elements 31, 32 being at least partially deformed.

The control method 100 may comprise a calibration step 102, in which a calibration line 50 is connected to the transport enclosure 2 by a measurement head 23 to generate a calibrated leak (FIG. 4). The pressure is measured in a measurement line 40 connected to a measurement head 23 engaged in a ventilation port 8 of the transport enclosure 2 coupled to the interface 20.

This calibration step 102 may be used, notably, to adjust the theoretical values of leaks deduced from the pressure measurements by comparison with the data in a real situation, notably in order to avoid taking into account the deformations of the transport enclosure 2 in overpressure. The calibration step 102 may be executed on the start-up of the monitoring device 1, and regularly thereafter.

The control method 100 may comprise a preliminary conditioning step 103 in which a predetermined initial pressure P0 is established in the measurement line 40 connected to a measurement head 23 engaged in a ventilation port 8 of the transport enclosure 2 coupled to the interface 20. The predetermined initial pressure P0 may be established by means of the sampling pump 44 and the flow rate control device 41.

The measurements made on the same transport enclosure 2 then show a good degree of repeatability. The measurements made on different transport enclosures 2 may then be compared with one another, facilitating the interpretation of the results. Additionally, the sampling pump 44 provides quick and easy control of the predetermined initial pressure P0, thus avoiding a fall in the production rate. This conditioning step 103 may be reiterated for each new control of the tightness.

The control of the tightness of the transport enclosure 2, properly so called, may be performed in two main ways.

According to a first example, the internal atmosphere of the transport enclosure 2 is brought to an overpressure, that is to say a pressure which exceeds atmospheric pressure by several millibars, by injecting a controlled flow of gas into a measurement head 23 engaged in a ventilation port 8 of the transport enclosure 2 coupled to the interface 20 (the step of pressure increase 104, FIG. 8).

The injection is then stopped, and the pressure drop in a measurement line 40 of a measurement head 23 engaged in a ventilation port 8 is measured (the step of pressure reduction 105).

The curve of the pressure drop over time may be used to determine the conductance of a leak flow. As the speed of the pressure drop increases, the leak becomes greater. This method is sensitive and particularly suitable for small leaks, such as those of the order of 0.1 l/s. The measurement of the pressure drop over time is possible because the inlet check valves 11 are kept open by the measurement heads 23 throughout the control period.

According to a second example, a constant flow of gas is injected into a measurement head 23 in a ventilation port 8 of the transport enclosure 2 coupled to the interface 20, and the change in pressure over time in the measurement line 40 is measured (FIG. 9).

The change in pressure as a function of time and of the flow of gas injected may be used to determine a leak flow. This method may be used to measure larger leaks such as those of the order of several l/s.

The fact that the inlet check valves 11 are kept open by the measurement heads 23 makes it possible to inject controlled gas flows without being subject to the variability of the resilient members 14 of the valves, which could increase the measurement uncertainty, given that the stiffness of the resilient members 14 may show large discrepancies from one transport enclosure 2 to another. The fact that the valves are kept open also makes it possible to avoid the effects of vibration of the valves when they are in an unstable state between the open position and the closed position.

Thus the control device 1 may be used to control the tightness of the transport enclosure 2 at the peripheral seal 7, by accessing the internal atmosphere of the transport enclosure 2 from outside the transport enclosure 2, without modification of the enclosure 2, which remains a standard type, regardless of whether or not the transport enclosure 2 comprises check valves 11, 15. The transport enclosure 2 may therefore be controlled in the course of production, in a fully automated way, while the enclosure contains semiconductor substrates 3.

The invention claimed is:

1. A device for controlling a tightness of at least one transport enclosure for conveyance and atmospheric storage of semiconductor substrates, the at least one transport enclosure comprising at least two ventilation ports, the device comprising:
   at least one interface configured to be coupled to the at least one transport enclosure, the at least one interface comprising at least two connecting heads, at least one connecting head of said heads being formed by a measurement head configured to engage in a ventilation port of the at least two ventilation ports of the at least one transport enclosure, the measurement head comprising:
      a projecting end piece, opening through at least one aperture, and
      a peripheral sealing element surrounding the projecting end piece,
   all of the at least two ventilation ports of the at least one transport enclosure being coupled to said at least one connecting head of the at least one interface;

at least one measurement line connected to the projecting end piece of the measurement head, the at least one measurement line comprising a flow rate control device and/or a pressure sensor; and a sampling line connected to the projecting end piece of the measurement head, the sampling line comprising a sampling pump.

2. The device according to claim 1, wherein said at least one connecting head of said heads is formed by an obstructing head comprising a blind sealing element configured to close a ventilation port of the at least one transport enclosure, said all of the at least two ventilation ports of the at least one transport enclosure being either engaged by the measurement head or closed by the obstructing head.

3. The device according to claim 1, wherein the measurement head is further configured to engage in a ventilation port of the at least one transport enclosure, while pushing back an inlet check valve if the ventilation port is equipped with the inlet check valve.

4. The device according to claim 1, wherein the peripheral sealing element is resilient and at least partially compressed or deformed when the at least one transport enclosure is coupled to the at least one interface.

5. The device according to claim 1, wherein the at least one interface further comprises at least one securing means configured for securing the at least one transport enclosure.

6. The device according to claim 1,
wherein the measurement head is movable, and
wherein the at least one interface further comprises at least one head actuator configured to move the at least two connecting heads between a withdrawn position and a projecting position for controlling the tightness.

7. The device according to claim 1, wherein the at least two connecting heads are fixed and project from the at least one interface.

8. The device according to claim 1, wherein the peripheral sealing element comprises a suction cup.

9. The device according to claim 2, wherein the at least one interface further comprises two measurement heads and two obstructing heads.

10. The device according to claim 1, wherein the at least one measurement line further comprises at least one calibration aperture fitted as a branch from the measurement head and a three-way valve configured to put the flow rate control device and/or the pressure sensor of the at least one measurement line into communication with the at least one calibration aperture while isolated from the measurement head.

11. The device according to claim 1, further comprising a calibration line connected to the projecting end piece of the measurement head, the calibration line comprising at least one calibration aperture.

12. A method for controlling tightness of at least one transport enclosure for conveyance and atmospheric storage of semiconductor substrates by means of a device for controlling the tightness of the at least one transport enclosure, the at least one transport enclosure comprising at least two ventilation ports,
the device comprising:
at least one interface configured to be coupled to the at least one transport enclosure, the at least one interface comprising at least two connecting heads, at least one connecting head of said heads being formed by a measurement head configured to engage in a ventilation port of the at least two ventilation ports of the at least one transport enclosure, the measurement head comprising:
a projecting end piece, opening through at least one aperture, and
a peripheral sealing element surrounding the projecting end piece,
all of the at least two ventilation ports of the at least one transport enclosure being coupled to said at least one connecting head of said heads of the at least one interface, and
at least one measurement line connected to the projecting end piece of the measurement head, the at least one measurement line comprising a flow rate control device and/or a pressure sensor; and
the method comprising:
coupling a transport enclosure is coupled to an interface of the device such that all ventilation ports of the transport enclosure are coupled to a connecting head of the interface, at least one connecting head being formed by a measurement head engaged in a ventilation port of the transport enclosure; and
injecting a controlled flow of gas into a measurement line connected to the measurement head engaged in the ventilation port of the transport enclosure coupled to the interface, after which the injection is stopped and a pressure drop in the measurement line is measured.

13. The method according to claim 12, wherein said all ventilation ports of the transport enclosure are either engaged by a measurement head or closed by an obstructing head of the interface, at least one connecting head being formed by the obstructing head closing the ventilation port of the transport enclosure.

14. The method according to claim 12, wherein a peripheral sealing element is at least partially compressed or deformed when the transport enclosure is coupled to the interface.

15. The method according to claim 12, further comprising performing a self-controlling step comprising measuring a pressure in a measurement line comprising a calibration aperture fitted as a branch from the measurement head, the calibration aperture being put into communication with a flow rate control device and a pressure sensor of the measurement line, while being isolated from the measurement head.

16. A method for controlling tightness of at least one transport enclosure for conveyance and atmospheric storage of semiconductor substrates by means of a device for controlling the tightness of the at least one transport enclosure, the at least one transport enclosure comprising at least two ventilation ports,
the device comprising:
at least one interface configured to be coupled to the at least one transport enclosure, the at least one interface comprising at least two connecting heads, at least one connecting head of said heads being formed by a measurement head configured to engage in a ventilation port of the at least two ventilation ports of the at least one transport enclosure, the measurement head comprising:
a projecting end piece, opening through at least one aperture, and
a peripheral sealing element surrounding the projecting end piece,
all of the at least two ventilation ports of the at least one transport enclosure being coupled to said at least one connecting head of said heads of the at least one interface, and at least one measurement line connected to the projecting end piece of the measurement head, the at least one measurement line comprising a flow rate control device and/or a pressure sensor; and the method comprising:
coupling a transport enclosure to an interface of the device such that all ventilation ports of the transport enclosure are coupled to a connecting head of the interface, at least one connecting head being formed by a measurement head engaged in a ventilation port of the transport enclosure; and injecting a constant flow of gas into a measurement line connected to the measurement head engaged in the ventilation port of the transport enclosure coupled to the interface, while a change in pressure over time in the measurement line is measured.

17. A method for controlling tightness of at least one transport enclosure for conveyance and atmospheric storage of semiconductor substrates by means of a device for controlling the tightness of the at least one transport enclosure, the at least one transport enclosure comprising at least two ventilation ports, the device comprising:
at least one interface configured to be coupled to the at least one transport enclosure, the at least one interface comprising at least two connecting heads, at least one connecting head of said heads being formed by a measurement head configured to engage in a ventilation port of the at least two ventilation ports of the at least one transport enclosure, the measurement head comprising:
a projecting end piece, opening through at least one aperture, and
a peripheral sealing element surrounding the projecting end piece,
all of the at least two ventilation ports of the at least one transport enclosure being coupled to said at least one connecting head of said heads of the at least one interface, and
at least one measurement line connected to the projecting end piece of the measurement head, the at least one measurement line comprising a flow rate control device and/or a pressure sensor; and the method comprising:
coupling a transport enclosure to an interface of the device such that all ventilation ports of the transport enclosure are coupled to a connecting head of the interface, at least one connecting head being formed by a measurement head engaged in a ventilation port of the transport enclosure; and performing a preliminary conditioning step comprising establishing a predetermined initial pressure in a measurement line connected to the measurement head engaged in the ventilation port of the transport enclosure coupled to the interface.

18. A method for controlling tightness of at least one transport enclosure for conveyance and atmospheric storage of semiconductor substrates by means of a device for controlling the tightness of the at least one transport enclosure, the at least one transport enclosure comprising at least two ventilation ports, the device comprising:
at least one interface configured to be coupled to the at least one transport enclosure, the at least one interface comprising at least two connecting heads, at least one connecting head of said heads being formed by a measurement head configured to engage in a ventilation port of the at least two ventilation ports of the at least one transport enclosure, the measurement head comprising:
a projecting end piece, opening through at least one aperture, and
a peripheral sealing element surrounding the projecting end piece,
all of the at least two ventilation ports of the at least one transport enclosure being coupled to said at least one connecting head of said heads of the at least one interface, and
at least one measurement line connected to the projecting end piece of the measurement head, the at least one measurement line comprising a flow rate control device and/or a pressure sensor; and the method comprising:
coupling a transport enclosure to an interface of the device such that all ventilation ports of the transport enclosure are coupled to a connecting head of the interface, at least one connecting head being formed by a measurement head engaged in a ventilation port of the transport enclosure; and performing a calibration step comprising connecting a calibration line to the transport enclosure by the measurement head engaged in the ventilation port of the transport enclosure coupled to the interface to generate a calibrated leak, and measuring a pressure in a measurement line connected to the measurement head engaged in the ventilation port of the transport enclosure coupled to the interface.

* * * * *